(12) United States Patent
Chen et al.

(10) Patent No.: US 11,899,485 B2
(45) Date of Patent: Feb. 13, 2024

(54) LINE DRIVER HAVING ADJUSTABLE CURRENT MIRROR ARRAY

(71) Applicant: SigmaStar Technology Ltd., Fujian (CN)

(72) Inventors: Zhun Chen, Shanghai (CN); Zhong-Yuan Wan, Shanghai (CN)

(73) Assignee: SIGMASTAR TECHNOLOGY LTD., Fujian (CN)

( * ) Notice: Subject to any disclaimer, the term of this patent is extended or adjusted under 35 U.S.C. 154(b) by 0 days.

(21) Appl. No.: 18/079,044

(22) Filed: Dec. 12, 2022

(65) Prior Publication Data

US 2023/0195154 A1 Jun. 22, 2023

(30) Foreign Application Priority Data

Dec. 20, 2021 (CN) .......................... 202111564058.5

(51) Int. Cl.
*G05F 3/26* (2006.01)
*H03K 19/0175* (2006.01)

(52) U.S. Cl.
CPC ....... *G05F 3/26* (2013.01); *H03K 19/017509* (2013.01)

(58) Field of Classification Search
CPC .............. G05F 3/26; H03K 19/017509; H03K 19/0005; H03K 19/00384; H03K 17/6871; H03H 11/30; H04B 3/03; H04L 25/0278; H04L 25/028; H04L 25/0264; H04L 25/0272; H03F 1/56
See application file for complete search history.

(56) References Cited

U.S. PATENT DOCUMENTS

| | | | | |
|---|---|---|---|---|
| 7,068,065 | B1 * | 6/2006 | Nasrullah | H03K 19/0005 326/87 |
| 2007/0296456 | A1 * | 12/2007 | van der Goes | H03F 3/45192 326/30 |
| 2020/0091883 | A1 * | 3/2020 | Sharma | H03F 3/45174 |
| 2020/0287376 | A1 * | 9/2020 | Yasusaka | H01L 27/0266 |

\* cited by examiner

*Primary Examiner* — Lincoln D Donovan
*Assistant Examiner* — Tyler J Pereny
(74) *Attorney, Agent, or Firm* — Edell, Shapiro & Finnan, LLC (57) ABSTRACT

A line driver includes a first resistive component, a second resistive component, an operational amplifier and an adjustable current mirror array circuit. A first terminal of the second resistive component and the first resistive component are coupled to a node, and a second terminal of the second resistive component is coupled to an output terminal. The operational amplifier receives a common mode voltage through the first resistive component, and generates a first signal and a second signal according to the common mode voltage and an input signal. The adjustable current mirror array circuit generates a first current to the node and a second current to the output terminal in response to the first and second signals, and adjusts a ratio of the second current to the first current in response to multiple control bits so as to set an output impedance of the output terminal.

12 Claims, 5 Drawing Sheets

LINE DRIVER HAVING ADJUSTABLE CURRENT MIRROR ARRAY

This application claims the benefit of China application Serial No. CN202111564058.5, filed on Dec. 20, 2021, the subject matter of which is incorporated herein by reference.

BACKGROUND OF THE INVENTION

Field of the Invention

The present application relates to a line driver, and more particular to a line driver using an adjustable current mirror array to adjust an output impedance.

Description of the Related Art

A line driver can be applied to a network system to reinforce a driving capability. In order to enhance quality of transmitted data, an output impedance of a line driver needs to match an impedance of a transmission line. In the prior art, a line driver adjusts an output impedance by using a resistor array formed by multiple switches and multiple resistors. However, in practice, due to influences of manufacturing process variations, resistance values of multiple resistors may drift, such that the output impedance becomes inaccurate and impedance matching is degraded. Moreover, due to a large swing of signals received or transmitted by a line driver, transistors having a higher withstand voltage are usually needed to implement the multiple switches above, and this may lead to conflicts against requirements or design limitations of certain applications (for example, more advances manufacturing processes).

SUMMARY OF THE INVENTION

In some embodiments, a line driver includes a first resistive component, a second resistive component, an operational amplifier and an adjustable current mirror array circuit. A first terminal of the second resistive component and the first resistive component are coupled to a node, and a second terminal of the second resistive component is coupled to an output terminal. The operational amplifier receives a common mode voltage through the first resistive component, and generates a first signal and a second signal according to the common mode voltage and an input signal. The adjustable current mirror array circuit generates a first current to the node and generates a second current to the output terminal in response to the first signal and the second signal, and adjusts a ratio of the second current to the first current in response to a plurality of control bits so as to set an output impedance of the output terminal.

Features, implementations and effects of the present application are described in detail in preferred embodiments with the accompanying drawings below.

BRIEF DESCRIPTION OF THE DRAWINGS

To better describe the technical solution of the embodiments of the present application, drawings involved in the description of the embodiments are introduced below. It is apparent that, the drawings in the description below represent merely some embodiments of the present application, and other drawings apart from these drawings may also be obtained by a person skilled in the art without involving inventive skills.

DETAILED DESCRIPTION OF THE INVENTION

All terms used in the literature have commonly recognized meanings. Definitions of the terms in commonly used dictionaries and examples discussed in the disclosure of the present application are merely exemplary, and are not to be construed as limitations to the scope and meanings of the present application. Similarly, the present application is not limited to the embodiments enumerated in the description of the application.

The term "coupled" or "connected" used in the literature refers to two or multiple elements being directly and physically or electrically in contact with each other, or indirectly and physically or electrically in contact with each other, and may also refer to two or more elements operating or acting with each other. As given in the literature, the term "circuit" may be a device connected by at least one transistor and/or at least one active element by a predetermined means so as to process signals.

Figure 1:
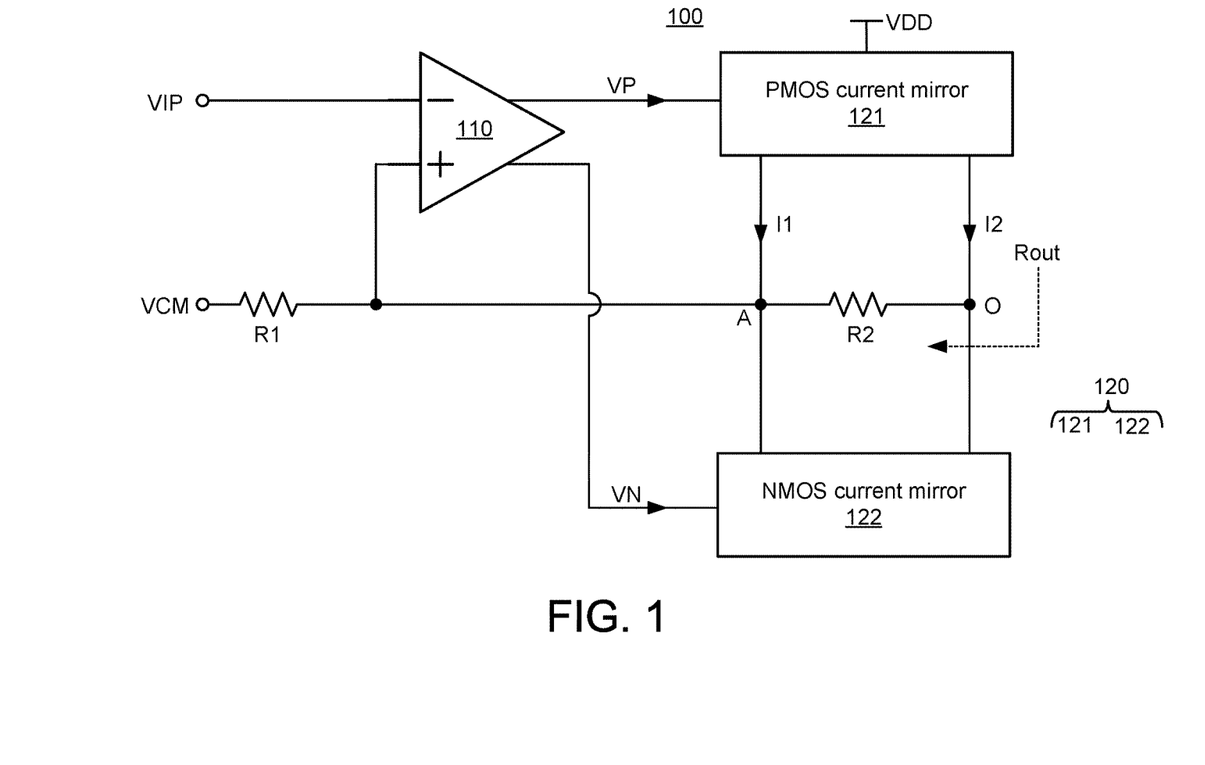
FIG. 1 is a schematic diagram of a line driver according to some embodiments of the present application.

FIG. 1 shows a schematic diagram of a line driver 100 according to some embodiments of the present application. In some embodiments, the line driver 100 can be applied (but not limited) to receive and transmit data in a wired network. In some embodiments, the line driver 100 is operable as (but not limited) a class AB amplifier.

The line driver 100 includes a resistive component R1, a resistive component R2, an operational amplifier 110 and an adjustable current mirror array circuit 120. A first terminal of the resistive component R1 receives a common mode voltage VCM, and a second terminal of the resistive component R1 and a first terminal of the resistive component R2 are coupled to a node A (which is coupled to a positive input terminal of the operational amplifier 110), and a second terminal of the resistive component R2 is coupled to an output terminal O. In some embodiments, the resistive component R1 and the resistive component R2 can be on-chip resistors, which may be, for example but not limited to, voltage-controlled resistors and polysilicon resistors implemented by transistors. In some embodiments, the resistive component R1 and the resistive component R2 can be resistors having fixed resistance values, or can be adjustable resistor arrays having variable resistance values.

A negative input terminal of the operational amplifier 110 receives an input signal VIP. The operational amplifier 110 can receive the common mode voltage VCM through the resistive component R1, and generate a signal VP and a signal VN according to the common mode signal VCM and the input signal VIP. In some embodiments, the signal VP and the signal VN can be differential signals. The adjustable current mirror array circuit 120 generates a current I1 to the first terminal (that is, the node A) of the resistive component R2 and generates a current I2 to the output terminal O in response to the signal VP and the signal VN, and adjusts a ratio (to be referred to as a ratio N) of the current I2 to the current I1 in response to multiple control bits D[0] to D[3] so as to set an output impedance of the output terminal O. For better understanding, classification is carried out according to actual conductivity types of transistors, and a circuit (for example, a current mirror circuit 230 in FIG. 2) for generating a current in the adjustable mirror array circuit 120 can include a PMOS current mirror 121 and an NMOS mirror 122. The PMOS current mirror 121 and the NMOS mirror 122 are stacked and coupled to the ground so as to generate the current I1 and the current I2 above. A specific embodiment of the adjustable current mirror array circuit 120 is to be described with reference to FIG. 2 and FIG. 3 below; however, it should be noted that the present application is not limited to the examples in FIG. 2 and FIG. 3.

By circuit analysis, it is derived that an output impedance Rout of the output terminal O satisfies the equation below:

$$Rout = \frac{R2}{1+N}$$

In the equation above, R2 represents a resistance value of the resistive component R2. By adjusting the ratio N of the current I2 to the current I1, the output impedance Rout of the output terminal O can be adjusted so as to match a load impedance (for example, an impedance of a transmission line). For example, the output impedance Rout decreases as the ratio N gets larger, and conversely, the output impedance Rout increases as the ratio N gets smaller. In some related techniques, the output impedance of a line driver is set by merely adjusting the resistance value of a resistor (for example, the resistance value of the resistive component R2). However, in practice, the resistance value of a resistor is prone to drift due to numerous variations (for example but not limited to, manufacturing process variations). Compared to the techniques above, in some embodiments of the present application, the adjustable current mirror array circuit 120 can trim a current value of the current I2 in response to the multiple control bits D[0] to D[3] so as to adjust the ratio N, further accurately adjusting the output impedance Rout.

Moreover, according to protocol requirements of certain applications, the voltage swing of the output terminal O needs to have a greater range (for example but not limited to, approximately ranging between 0.4 V and 2.9 V). In general, in order to support this voltage range, transistors having a higher withstand voltage are usually used to implement various circuits. In some embodiments, as described with reference to FIG. 3 shortly, the circuits in the line driver 100 can be implemented by transistors having a lower withstand voltage. For example, as shown in FIG. 1, the adjustable current mirror array circuit 120 is driven by a power supply voltage VDD, and the withstand voltage of each of the multiple transistors (for example, multiple transistors shown in FIG. 3) included in the adjustable current mirror array circuit 120 can be lower than the power supply voltage VDD. Thus, in certain applications in which transistors having a high withstand voltage cannot be used, transistors having a lower withstand voltage can still be used to implement the line driver 100. For example, the power supply voltage VDD is 3.3 V, and the multiple transistors included in the adjustable current mirror array circuit 120 can be implemented by transistors predetermined to operate under 1.8 V. It should be noted that the numerical values of the power supply voltage VDD and/or the withstand voltages are examples, and the present application is not limited to these exemplary numerical values.

Figure 2:
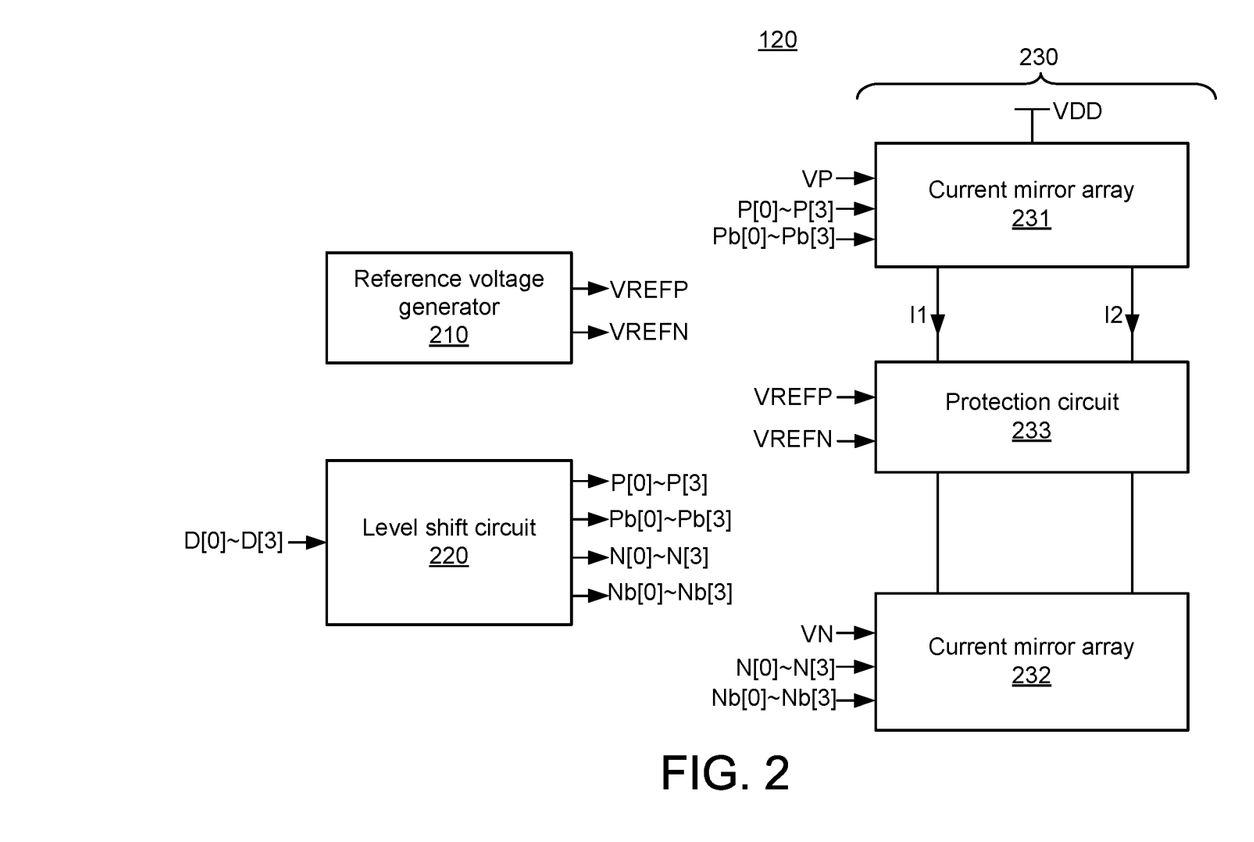
FIG. 2 is a schematic diagram of an adjustable current mirror array circuit in FIG. 1 according to some embodiments of the present application.

FIG. 2 shows a schematic diagram of the adjustable current mirror array circuit 120 in FIG. 1 according to some embodiments of the present application. For better understanding, the adjustable current mirror array circuit 120 in FIG. 2 is described and classified in terms of function. In this example, the adjustable current mirror array circuit 120 includes a reference voltage generator 210, a level shift circuit 220 and a current mirror circuit 230. The reference voltage generator 210 generates a reference voltage VREFP and a reference voltage VREFN. In some embodiments, the reference voltage generator 210 can be implemented by a low-dropout regulator, so as to directly generate the reference voltage VREFP and the reference voltage VREFN. In some embodiments, the reference voltage generator 210 can be implemented by the configuration shown in FIG. 5.

The level shift circuit 220 shifts levels of the multiple control bits D[0] to D[3] to generate multiple bits P[0] to P[3] and multiple bits Pb[0] to Pb[3], and generates multiple bits N[0] to N[3] and multiple bits Nb[0] to Nb[3] based on the multiple control bits D[0] to D[3]. As described above, the multiple transistors included in the current mirror array circuit 120 can be implemented by transistors predetermined to operate under 1.8 V, and the adjustable current mirror array circuit 120 is powered by the power supply voltage VDD of 3.3 V. To ensure correct operations of the PMOS current mirror 121, the level shift circuit 220 can be used to control level shifting of signals of P-type transistors in the PMOS current mirror 121. For example, the level shift circuit 220 can sequentially perform a first-stage shift and a second-stage shift according to the multiple control bits D[0] to D[3]. In the first-stage shift, the levels of the multiple control bits D[0] to D[3] are adjusted from between 0 V and 1.8 V to between 0 V and 3.3 V (that is, the level of the power supply voltage VDD). In the second-stage shift, the levels of the multiple control bits D[0] to D[3] are adjusted from between 0 V and 3.3 V to between 1.8 V and 3.3 V. With the operation above, the level of the logical value 0 of each of the multiple bits P[0] to P[3] and the multiple bits Pb[0] to Pb[3] is equivalent to 1.8 V, and the level of the logical value 1 of each of the multiple bits P[0] to P[3] and the multiple bits Pb[0] to Pb[3] is equivalent to 3.3 V. As such, it is ensured that the PMOS current mirror 121 can operate correctly.

With a protection circuit 223 to be described shortly, the NMOS current mirror 122 is operable at a lower voltage range. Thus, the level shift circuit 220 does not perform level shifting on the signals (for example, the multiple bits N[0] to N[3] and the multiple bits Nb[0] to Nb[3]) of the NMOS current mirror 122. For example, the level shift circuit 220 can include a buffer circuit (not shown), which outputs the multiple control bits D[0] to D[3] as the multiple bits N[0] to N[3] and the multiple bits Nb[0] to Nb[3]. In some embodiments, a corresponding one among the multiple bits P[0] to P[3] and a corresponding one among the multiple bits Pb[0] to Pb[3] have different logical values, and a corresponding one among the multiple bits N[0] to N[3] and a corresponding one among the multiple bits Nb[0] to Nb[3] have different logical values. For example, when the bit P[0] has a logical value 0, the bit Pb[0] has a logical value 1; alternatively, when the bit P[1] has a logical value 1, the bit Pb[1] has a logical value 0. Similarly, when the bit N[0] has a logical value 0, the bit Nb[0] has a logical value 1; alternatively, when the bit N[1] has a logical value 1, the bit Nb[1] has a logical value 0. Similarly, the correspondence between the remaining multiple bits P[2] and P[3], the multiple bits P2b[0] to P2b[3], the multiple bits N[2] and N[3] and the multiple bits Nb[2] and Nb[3] can be understood.

In some embodiments, the level shift circuit 200 can be implemented by a unidirectional level shifter. In some embodiments, the level shift circuit 200 can be implemented by a cross-coupled CMOS level shifter. It should be noted that the implementation details of the level shift circuit 220 above are examples, and are not to be construed as limitation to the present application. Various level shift circuits 220 that can implement similar operations are to be encompassed within the scope of the present application.

Figure 3:
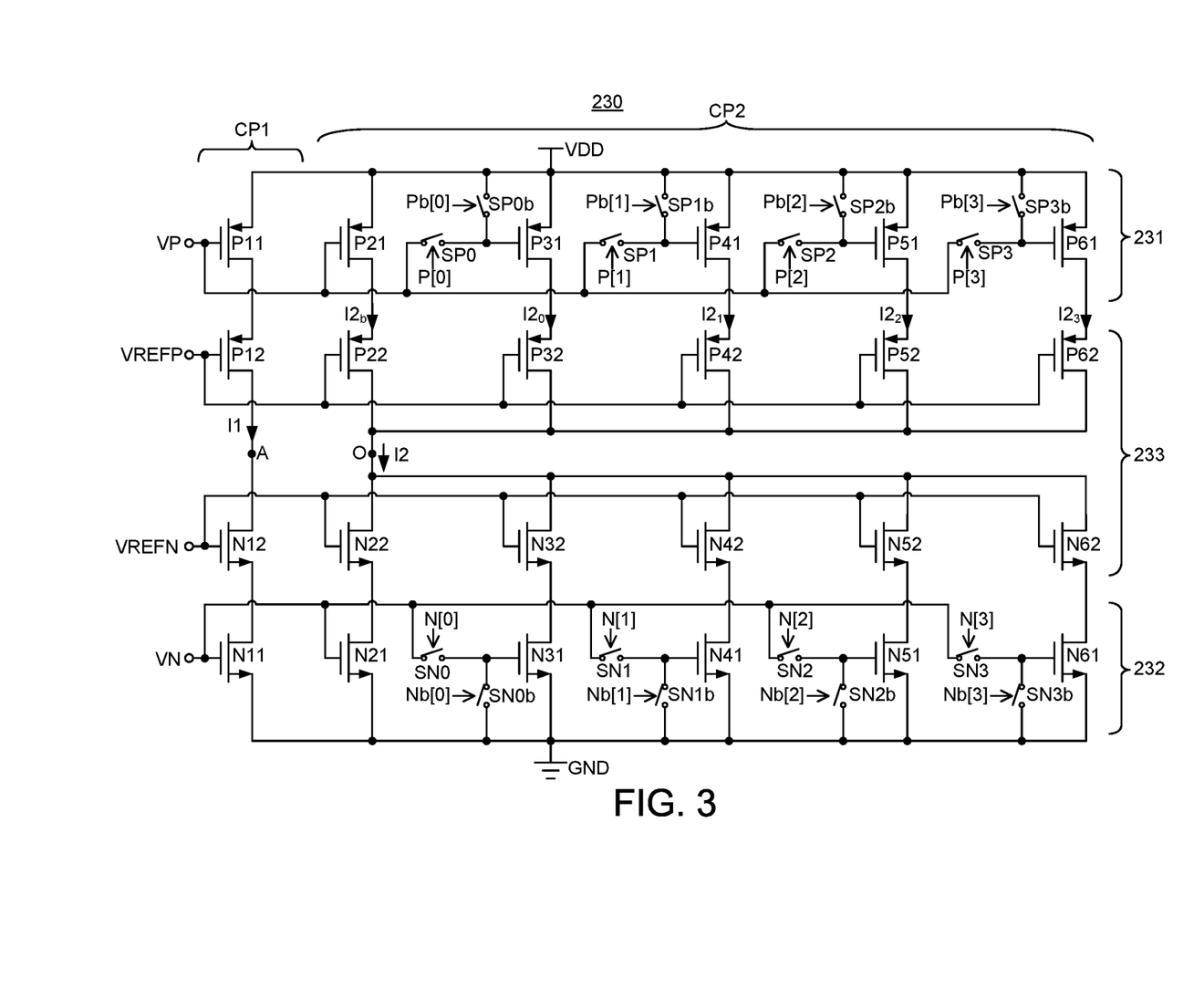
FIG. 3 is a schematic diagram of a current mirror circuit in FIG. 2 according to some embodiments of the present application.

The current mirror circuit 230 includes a current mirror array 231, a current mirror array 232 and the protection circuit 233. The P-type transistors (as shown in FIG. 3) in the current mirror array 231 and the protection circuit 233 can correspond to the PMOS current mirror 121 in FIG. 1, and the N-type transistors (as shown in FIG. 3) included in the current mirror array 232 and the protection circuit 233 can correspond to the NMOS current mirror 122 in FIG. 1. The current mirror array 231 is biased by the signal VP and is switched according to the multiple bits P[0] to P[3] and the multiple bits Pb[0] to Pb[3]; the current mirror array 232 is biased by the signal VN and is switched according to the multiple bits N[0] to N[3] and the multiple bits Nb[0] to Nb[3]. The protection circuit 233 is coupled between the current mirror array 231 and the current mirror array 232, and is biased by the reference voltage VREFP and the reference voltage VREFN, so as to provide the current mirror array 231 and the current mirror array 232 with voltage protection. The current mirror array 231, the current mirror array 232 and the protection circuit 233 together generate the current I1 and the current I2 above.

FIG. 3 shows a schematic diagram of the current mirror circuit 230 in FIG. 2 according to some embodiments of the present application. The current mirror array 231 includes multiple transistors P11 to P61 and multiple switches SP0 to SP3 and SP0b to SP3b, the current mirror array 232 includes multiple transistors N11 to N61 and multiple switches SN0 to SN3 and SN0b to SN3b, and the protection circuit 233 includes multiple transistors P12 to P62 and N12 to N62. The multiple transistors P11 to P61 and P12 to P62 are P-type transistors, and the multiple transistors N11 to N61 and N12 to N62 are N-type transistors.

In terms of function, the current mirror array 231, the current mirror array 232 and the protection circuit 233 can be classified into a circuit portion CP1 and a circuit portion CP2. The circuit portion CP1 includes the multiple transistors P11, P12, N11 and N12, and the circuit portion CP2 includes the multiple transistors P21 to P61, P22 to P62, N21 to N61 and N22 to N62 and multiple switches SP0 to SP3, SP0b to SP3b, SN0 to SN3 and SN0b to SN3b.

Specifically, a first terminal (for example, the source) of the transistor P11 receives the power supply voltage VDD, a second terminal (for example, the drain) of the transistor P11 is coupled to a first terminal of the transistor P12, and a control terminal (for example, the gate) of the transistor P11 receives the signal VP. In other words, the transistor P11 can be biased by the signal VP. A second terminal of the transistor P12 is coupled to the node A, and a control terminal of the transistor P12 receives the reference voltage VREFP. A first terminal (for example, the drain) of the transistor N12 is coupled to the node A, a second terminal (for example, the source) of the transistor N12 is coupled to a first terminal of the transistor N11, and a control terminal (for example, the gate) of the transistor N12 receives the reference signal VREFN. In other words, the transistor P12 can be biased by the reference voltage VREFP, the transistor N12 can be biased by the reference voltage VREFN, and the transistor P12 and the transistor N12 are coupled to the node A. A second terminal of the transistor N11 is coupled to the ground so as to receive a ground voltage GND, and a control terminal of the transistor N11 receives the signal VN. In other words, the transistor N11 can be biased by the signal VN, and is coupled between the transistor N12 and the ground. With the configuration above, the circuit portion CP1 can generate the current I1 to the node A.

Moreover, the circuit portion P2 can be divided into a first current path and multiple second current paths that are connected in parallel. For example, the multiple transistors P21, P22, N21 and N22 form the first current path, the multiple transistors P31, P32, N31 and N32 and the multiple switches SP0, SP0b, SN0 and SN0b form a first second current path, the multiple transistors P41, P42, N41 and N42 and the multiple switches SP1, SP1b, SN1 and SN1b form a second second current path, the multiple transistors P51, P52, N51 and N52 and the multiple switches SP2, SP2b, SN2 and SN2b form a third second current path, and the multiple transistors P61, P62, N61 and N62 and the multiple switches SP3, SP3b, SN3 and SN3b form a fourth second current paths.

The first current path is biased by the signal VP, the reference voltage VREFP, the reference voltage VREFN and the signal VN, so as to constantly generate a partial current $I2_b$ in the current I2. Specifically, a first terminal of the transistor P21 receives the power supply voltage VDD, a second terminal of the transistor P21 is coupled to a first terminal of the transistor P22, and a control terminal of the transistor P21 receives the signal VP. A second terminal of the transistor P22 is coupled to the output node 0, and a control terminal of the transistor P22 receives the reference voltage VREFP. A first terminal of the transistor N22 is coupled to the output node 0, a second terminal of the transistor N22 is coupled to a first terminal of the transistor N21, and a control terminal of the transistor N22 receives the reference signal VREFN. A second terminal of the transistor N21 is coupled to the ground so as to receive the ground voltage GND, and a control terminal of the transistor N22 receives the signal VN. With the configuration above, the first current path can generate the partial current $I2_b$. In some embodiments, an aspect ratio of each of the multiple transistors P21, P22, N21 and N22 is a specific multiple (for example, m1 times) of an aspect ratio of each of the multiple transistors P11, P12, N11 and N12 in the circuit portion CP1, such that the partial current I2b is m1 times the current I1.

The multiple second current paths selectively generate multiple partial currents $I2_0$, $I2_1$, $I2_2$ and $I2_3$ in the current I2 according to the multiple bits P[0] to P[3], Pb[0] to Pb[3], N[0] to N[3] and Nb[0] to Nb[3]. Taking the first second current path for example, a first terminal of the transistor P31 receives the power supply voltage VDD, a second terminal of the transistor P31 is coupled to a first terminal of the transistor P32, and a control terminal of the transistor P31 is coupled to one terminal of the switch SP0 and one terminal of the switch SP0b. The other terminal of the switch SP0 receives the signal VP, and the switch SP0 is selectively turned on according to the bit P[0] so as to provide the signal VP to bias the transistor P31. The other terminal of the switch SP0b receives the power supply voltage VDD, and the switch SP0b is selectively turned on according to the bit Pb[0] so as to provide the power supply voltage VDD to turn off the transistor P31. The switch SP0b is turned off when the switch SP0 is turned on. As such, the transistor P31 can receive the signal VP through the switch SP0, and be biased by the signal VP. Alternatively, the switch SP0 is turned off when the switch SP0b is turned on. As such, the transistor P31 can receive the power supply voltage VDD through the switch SP0b, and be accordingly turned off. A second terminal of the transistor P32 is coupled to the output node O, and a control terminal of the transistor P32 receives the reference voltage VREFP.

Similarly, a first terminal of the transistor N32 is coupled to the output node O, a second terminal of the transistor N32 is coupled to a first terminal of the transistor N31, and a control terminal of the transistor N32 receives the reference signal VREFN. A second terminal of the transistor N31 is coupled to the ground so as to receive a ground voltage GND, and a control terminal of the transistor N31 is coupled to one terminal of the switch SN0 and one switch of the switch SN0b. The other terminal of the switch SN0 receives the signal VN, and the switch SN0 is selectively turned on according to the bit N[0] so as to provide the signal VN to bias the transistor N31. The other terminal of the switch SN0b receives the ground voltage GND, and the switch SN0b is selectively turned on according to the bit Nb[0] so as to provide the ground voltage to turn off the transistor N31. Thus, the switch SN0b is turned off when the switch SN0 is turned on. As such, the transistor N31 can receive the signal VN through the switch SN0, and be biased by the signal VN. Alternatively, the switch SN0 is turned off when the switch SN0b is turned on. As such, the transistor N31 can receive the ground voltage GND through the switch SN0b, and be accordingly turned off.

In some embodiments, in the same second current path (for example, the first second current path), the switch SP0 and the switch SN0 have the same on state, and the switch SP0b and the switch SN0b have the same on state. For example, the switch SN0 is also turned on when the switch SP0 is turned on (at this point, the switch SP0n and the switch SN0b are both turned off). Under this condition, the first second current path can generate the partial current $I2_0$. Alternatively, the switch SN0 is also turned off when the switch SP0 is turned off (at this point, the switch SP0n and the switch SN0b are both turned on). Under this condition, the first second current path is off and does not generate the partial current I2o. The configuration details of the remaining second current paths can be referred from the configuration details associated with the first second current path, and are omitted herein.

In some embodiments, an aspect ratio of each of the multiple transistors P31, P32, N31 and N32 of the first second current path is a specific multiple (for example, m2 times) of the aspect ratio of each of the multiple transistors P11, P12, N11 and N12 in the circuit portion CP1, such that the partial current $I2_0$ is m2 times the current I1. Similarly, an aspect ratio of each of the multiple transistors P41, P42, N41 and N42 of the second second current path is a specific multiple (for example, m3 times) of the aspect ratio of each of the multiple transistors P11, P12, N11 and N12 in the circuit portion CP1, such that the partial current $I2_1$ is m3 times the current I1. An aspect ratio of each of the multiple transistors P51, P52, N51 and N52 of the third second current path is a specific multiple (for example, m4 times) of the aspect ratio of each of the multiple transistors P11, P12, N11 and N12 in the circuit portion CP1, such that the partial current $I2_2$ is m4 times the current I1. An aspect ratio of each of the multiple transistors P61, P62, N61 and N62 of the fourth second current path is a specific multiple (for example, m5 times) of the aspect ratio of each of the multiple transistors P11, P12, N11 and N12 in the circuit portion CP1, such that the partial current $I2_3$ is m5 times the current I1. In some embodiments, the value m2, the value m3, the value m4 and the value m5 above can be (but not limited to) defined based on binary coding. For example, the value m1 is 12, the value m2, the value m3, the value m4 and the value m5 can respectively be 1, 2, 4 and 8. As such, if all the second current paths are turned off, the current I2 is equivalent to the partial current $I2_b$. Under this condition, the ratio N is 12. Alternatively, if all the second current paths are all turned on, the current I2 is equivalent to the total of multiple partial currents $I2_b$ and $I2_0$ to $I2_3$. Under this condition, the ratio N is 27 (=12+1+2+4+8). With the configuration above, the current I2 can be trimmed by means of turning on (or off) more second current paths, further adjusting the output impedance Rout.

Moreover, as shown in FIG. 3, the multiple transistors P12 to P62 in the protection circuit 233 are biased and turned on by the reference voltage VREFP, and the multiple transistors N12 to N62 in the protection circuit 233 are biased and turned on by the reference voltage VREFN. These transistors can withstand an excessive voltage difference in substitution for the multiple transistors in the current mirror array 231 and the current mirror array 232, so as to ensure that the multiple transistors in the current mirror array 231 and the current mirror array 232 are not damaged. As such, the multiple transistors in the current mirror circuit 230 can be implemented by transistors having a lower withstand voltage.

Figure 4:
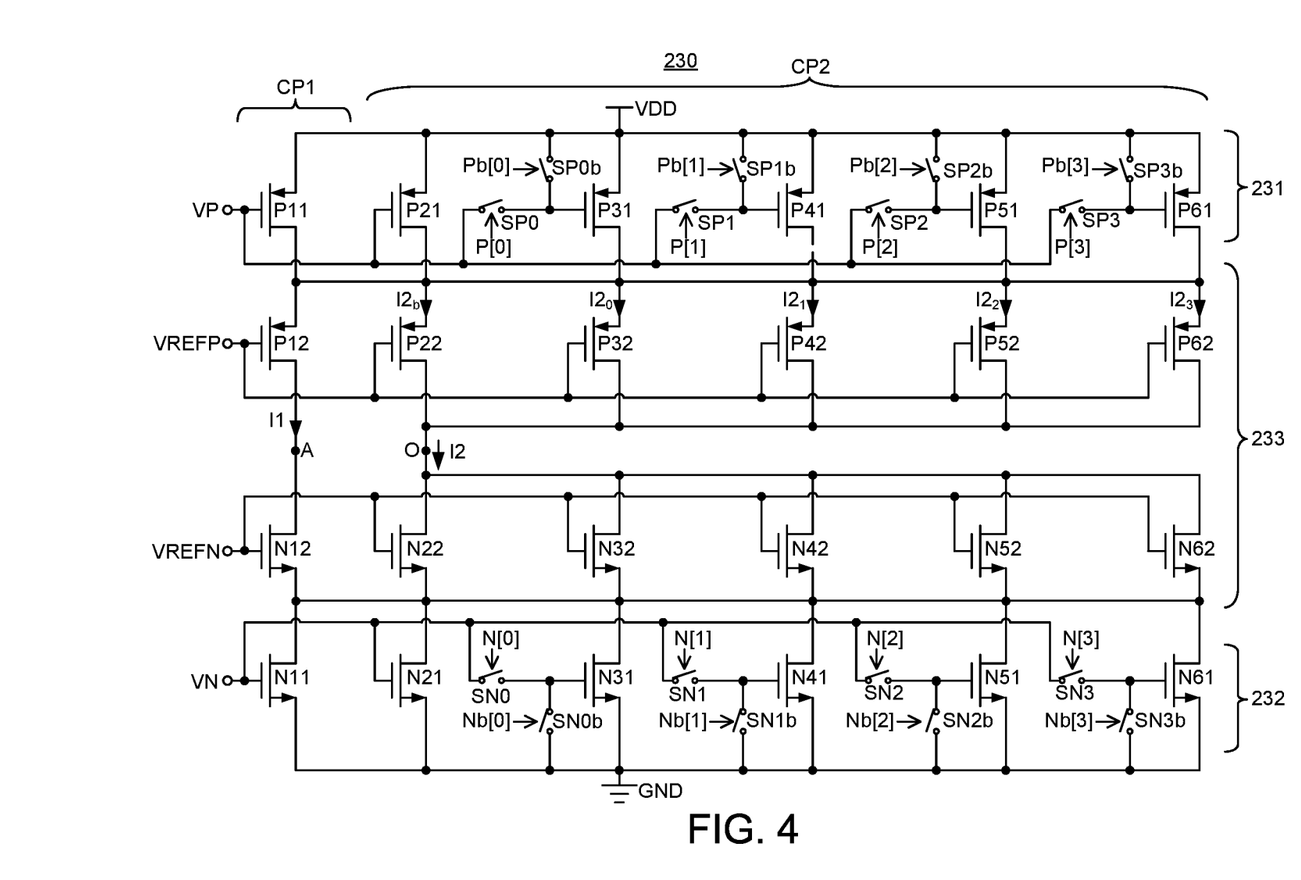
FIG. 4 is a schematic diagram of a current mirror array circuit in FIG. 2 according to some embodiments of the present application.

FIG. 4 shows a schematic diagram of the current mirror circuit 230 in FIG. 2 according to some embodiments of the present application. Different from FIG. 3, in the protection circuit 233 of this example, first terminals (for example, the sources) of the multiple transistors P12 to P62 are coupled to one another, and second terminals (for example, the sources) of the multiple transistors N12 to N62 are coupled to one another. It should be noted that the connection details of the protection circuit 233 above are examples, and are not to be construed as limitation to the present application. Various related configurations capable of providing voltage protection are encompassed with the scope of protection of the protection circuit 233 of the present application.

Figure 5:
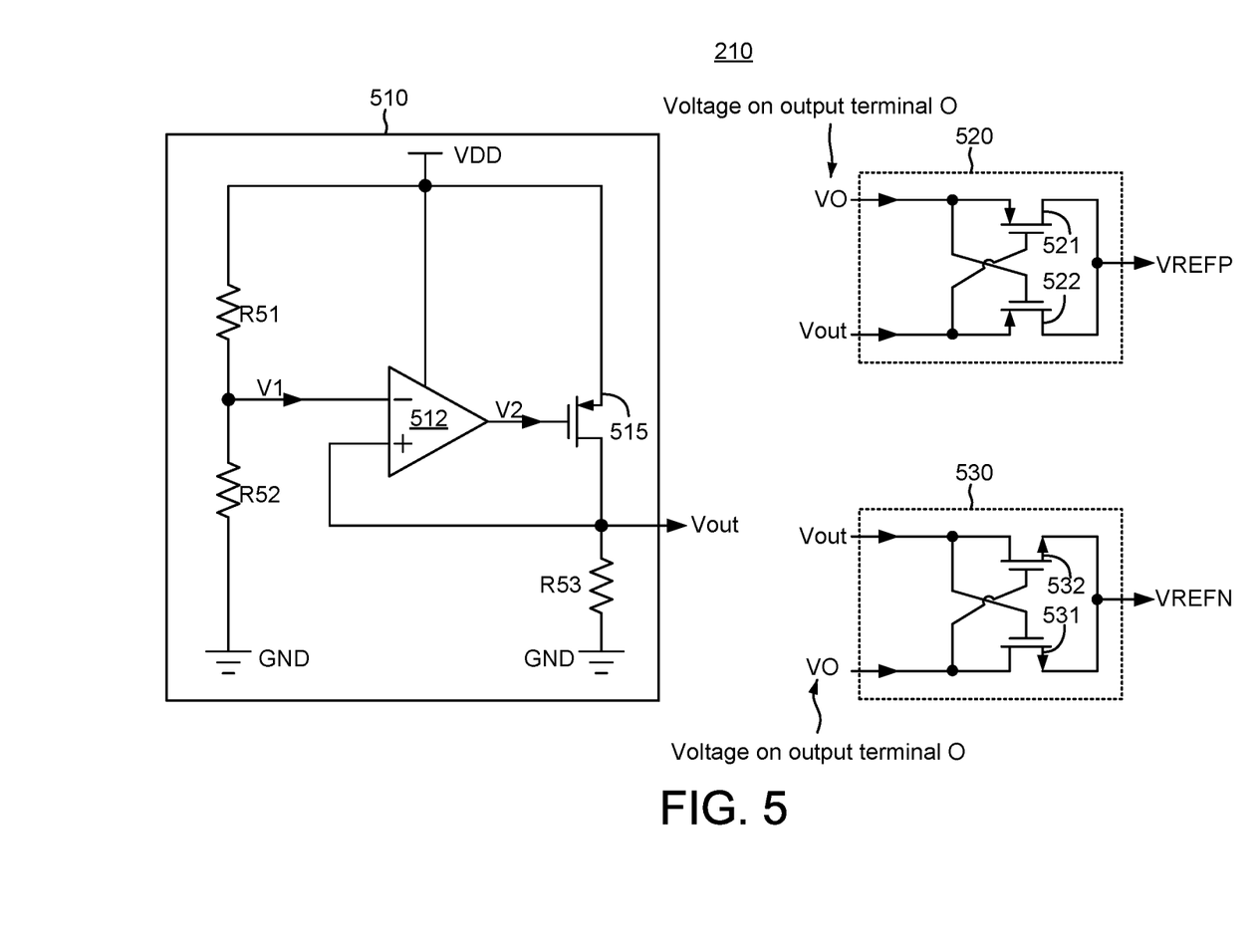
FIG. 5 is a schematic diagram of a reference voltage generator in FIG. 2 according to some embodiments of the present application.

FIG. 5 shows a schematic diagram of the reference voltage generator 210 in FIG. 2 according to some embodiments of the present application. The reference voltage generator 210 includes a low-dropout regulator 510, a comparator 520 and a comparator 530. The low-dropout regulator 510 generates an output voltage Vout. The comparator 520 outputs, between a voltage (to be referred to as a voltage VO) on the output terminal O in FIG. 1 or FIG. 3 and the output voltage Vout, the one having a higher level as the reference voltage VREFP. The comparator 530 outputs, between the voltage VO and the output voltage Vout, the one having a lower level as the reference voltage VREFN.

As described above, the line driver 100 can be applied to receive and transmit data in a wired network. When the system receives data signals through the output terminal O, the line driver 100 may stay inoperative. If the swing of the data signals (equivalent to the voltage VO) received by the output terminal O is overly large, the multiple transistors (for example but not limited to, the transistor P62 and the transistor N62 in FIG. 3 or FIG. 4) in the protection circuit 233 may become unintentionally turned on, further reducing linearity of the data received. To avoid the issue above, the voltage VO can be detected by the comparator 520 and the comparator 530, so as to dynamically generate the reference voltage VREFP having the higher level and the reference voltage VREFN having the lower level, thereby ensuring that the multiple transistors in the protection circuit 233 do not become unintentionally turned on.

In some embodiments, the low-dropout regulator 510 includes a resistive component R51, a resistive component R52, a resistive component R53, a transistor 515 and an amplifier 512. The resistive component R51 can receive the power supply voltage VDD and output a voltage V1. The resistive component R52 is coupled between the resistive component R51 and the ground. The amplifier 512 generates a voltage V2 according to the output voltage Vout and the voltage V1. The transistor 515 generates the output voltage Vout according to the voltage V2. The resistive component R53 is coupled between the transistor 515 and the ground.

Specifically, a first terminal of the resistive component R51 receives the power supply voltage VDD, and a second terminal of the resistive component R51 is coupled to a first terminal of the resistive component R52 and outputs the voltage V1 to a negative input terminal of the amplifier 512. A second terminal of the resistive component R52 is coupled to the ground so as to receive the ground voltage GND. The transistor 515 is a P-type transistor. A first terminal of the transistor 515 receives the power supply voltage VDD, and a second terminal of the transistor 515 is coupled to a first terminal of the resistive component R53 and is used to generate the output voltage Vout. A second terminal of the resistive component R53 is coupled to the ground so as to receive the ground voltage GND. A positive input terminal of the amplifier 512 is coupled to the second terminal of the transistor 515 so as to receive the output voltage Vout. The amplifier 512 can generate the voltage V2 according to the voltage V1 and the output voltage Vout, and transmit the voltage V2 to a control terminal of the transistor 515. As such, the transistor 515 can adjust a current flowing through the resistive component R53 according to the voltage V2 and generate the corresponding output voltage Vout. It should be noted that the implementation details of the low-dropout regulator 510 above are examples, and are not to be construed as limitation to the present application. Various low-dropout regulators 510 are encompassed within the scope of the present application.

In some embodiments, the comparator 520 includes a transistor 521 and a transistor 522. The transistor 521 and the transistor 522 are two cross-coupled P-type transistors. Specifically, a first terminal of the transistor 521 is coupled to a control terminal of the transistor 522 and receives the voltage VO, a first terminal of the second transistor 522 is coupled to a control terminal of the transistor 521 and receives the output voltage Vout, and second terminals of the transistor 521 and the transistor 522 are coupled to each other so as to generate the reference voltage VREFP. Similarly, the comparator 530 includes a transistor 531 and a transistor 532. The transistor 531 and the transistor 532 are two cross-coupled N-type transistors. Specifically, a first terminal of the transistor 531 is coupled to a control terminal of the transistor 532 and receives the voltage VO, a first terminal of the second transistor 532 is coupled to a control terminal of the transistor 531 and receives the output voltage Vout, and second terminals of the transistor 531 and the transistor 532 are coupled to each other so as to generate the reference voltage VREFN. It should be noted that the implementation details of the comparator 520 and the comparator 530 above are examples, and are not to be construed as limitation to the present application. Various comparators 520 and comparators 530 that can implement similar operations are to be encompassed within the scope of the present application.

In conclusion, a line driver according to some embodiments of the present application can use an adjustable current mirror array circuit to adjust an output impedance. Thus, the issue of inaccuracy of resistive components as a result of manufacturing process variations can be improved, and an output impedance can be accurately trimmed. Moreover, a line driver according to some embodiments of the present application can be implemented by transistors having a lower withstand voltage, and thus provide a broader range of applicability.

While the present application has been described by way of example and in terms of the preferred embodiments, it is to be understood that the present application is not limited thereto. Various modifications made be made to the technical features of the present application by a person skilled in the art on the basis of the explicit or implicitly disclosures of the present application. The scope of the appended claims of the present application therefore should be accorded with the broadest interpretation so as to encompass all such modifications.

What is claimed is:

1. A line driver, comprising:
a first resistive component;
a second resistive component, wherein a first terminal of the second resistive component and the first resistive component are coupled to a node, and a second terminal of the second resistive component is coupled to an output terminal;
an operational amplifier, receiving a common mode voltage through the first resistive component, and generating a first signal and a second signal according to the common mode voltage and an input signal; and
an adjustable current mirror array circuit, generating a first current to the node and generating a second current to the output terminal in response to the first signal and the second signal, and adjusting a ratio of the second current to the first current in response to a plurality of control bits so as to set an output impedance of the output terminal,
wherein the adjustable current mirror array circuit comprises:
a reference voltage generator, generating a first reference voltage and a second reference voltage;
a level shift circuit, shifting levels of the control bits to generate a plurality of first bits and a plurality of second bits, and generating a plurality of third bits and a plurality of fourth bits based on the control bits,
wherein a corresponding one among the first bits and a corresponding one among the second bits have different logical values, and a corresponding one among the third bits and a corresponding one among the fourth bits have different logical values; and
a current mirror circuit, biased by the first reference voltage and the second reference voltage, and controlled by the first bits, the second bits, the third bits and the fourth bits to generate the first current and the second current.

2. The line driver according to claim 1, wherein the current mirror circuit comprises:
a first current mirror array, biased by the first signal, and switched according to the first bits and the second bits;
a second current mirror array, biased by the second signal, and switched according to the third bits and the fourth bits; and
a protection circuit, coupled between the first current mirror array and the second current mirror array, and biased by the first reference voltage and the second reference voltage so as to provide the first current mirror array and the second current mirror array with voltage protection, wherein the first current mirror array, the second current mirror array and the protection circuit together generate the first current and the second current.

3. The line driver according to claim 2, wherein the first current mirror array, the second current mirror array and the protection circuit comprise a first circuit portion for generating the first current, and the first circuit portion comprises:
a first P-type transistor, biased by the first signal, and receiving a power supply voltage;
a second P-type transistor, biased by the first reference voltage;
a first N-type transistor, biased by the second reference voltage, the first N-type transistor and the second P-type transistor coupled to the node; and
a second N-type transistor, biased by the second signal, and coupled between the first N-type transistor and a ground.

4. The line driver according to claim 3, wherein the first current minor array, the second current mirror array and the protection circuit comprise a second circuit portion for generating the second current, and the second circuit portion comprises:
a first current path, biased by the first signal, the first reference voltage, the second reference voltage and the second signal to constantly generate a first partial current in the second current; and
a plurality of second current paths, selectively generating a plurality of second partial currents in the second current according to the first bits, the second bits, the third bits and the fourth bits.

5. The line driver according to claim 4, wherein one of the second current paths comprises:
a third P-type transistor, receiving the power supply voltage;
a first switch, selectively turned on according to a corresponding one among the first bits, so as to provide the power supply voltage to turn off the third P-type transistor;
a second switch, selectively turned on according to a corresponding one among the second bits, so as to provide the first signal to bias the third P-type transistor;
a fourth P-type transistor, biased by the first reference voltage, and coupled between the third P-type transistor and the output terminal;
a third N-type transistor, biased by the second reference voltage, and coupled to the output terminal;
a fourth N-type transistor, coupled between the third N-type transistor and the ground;
a third switch, selectively turned on according to a corresponding one among the third bits, so as to provide a ground voltage to turn off the fourth N-type transistor; and
a fourth switch, selectively turned on according to a corresponding one among the fourth bits, so as to provide the second signal to bias the fourth N-type transistor.

6. The line driver according to claim 5, wherein a source of the second P-type transistor is coupled to a source of the fourth P-type transistor, and a source of the second N-type transistor is coupled to a source of the third N-type transistor.

7. The line driver according to claim 1, wherein the reference voltage generator comprises:

a low-dropout regulator, generating an output voltage;
a first comparator, outputting, between a voltage on the output terminal and the output voltage, one having a higher level as the first reference voltage; and
a second comparator, outputting, between the voltage on the output terminal and the output voltage, one having a lower level as the second reference voltage.

8. The line driver according to claim 7, wherein the low-dropout regulator comprises:
a third resistive component, receiving the power supply voltage, and outputting a first voltage;
a fourth resistive component, coupled between the third resistive component and a ground;
an amplifier, generating a second voltage according to the output voltage and the first voltage;
a transistor, generating the output voltage according to the second voltage; and
a fifth resistive component, coupled between the transistor and the ground.

9. The line driver according to claim 7, wherein the first comparator comprises:
a first P-type transistor, wherein a first terminal of the first P-type transistor receives the voltage on the output terminal; and
a second P-type transistor, wherein a first terminal of the second P-type transistor is coupled to a control terminal of the first P-type transistor and receives the output voltage, a second terminal of the second P-type transistor is coupled to a second terminal of the first P-type transistor so as to generate the first reference voltage, and a control terminal of the second P-type transistor is coupled to the first terminal of the first P-type transistor.

10. The line driver according to claim 7, wherein the second comparator comprises:
a first N-type transistor, wherein a first terminal of the first N-type transistor receives the voltage on the output terminal; and
a second N-type transistor, wherein a first terminal of the second N-type transistor is coupled to a control terminal of the first N-type transistor and receives the output voltage, a second terminal of the second N-type transistor is coupled to a second terminal of the first N-type transistor so as to generate the second reference voltage, and a control terminal of the second N-type transistor is coupled to the first terminal of the first N-type transistor.

11. The line driver according to claim 1, wherein the adjustable current mirror array circuit comprises a plurality of transistors, the transistors are powered by a power supply voltage, and a withstand voltage of each of the transistors is lower than the power supply voltage.

12. A line driver, comprising:
a first resistive component;
a second resistive component, wherein a first terminal of the second resistive component and the first resistive component are coupled to a node, and a second terminal of the second resistive component is coupled to an output terminal;
an operational amplifier, receiving a common mode voltage through the first resistive component, and generating a first signal and a second signal according to the common mode voltage and an input signal; and
an adjustable current mirror array circuit, generating a first current to the node and generating a second current to the output terminal in response to the first signal and the second signal, and adjusting a ratio of the second current to the first current in response to a plurality of control bits so as to set an output impedance of the output terminal, wherein the output impedance decreases as a ratio of the second current to the first current gets larger.

* * * * *